United States Patent
Mallinson

(10) Patent No.: US 7,953,782 B2
(45) Date of Patent: May 31, 2011

(54) DIGITAL FORCED OSCILLATION BY DIRECT DIGITAL SYNTHESIS

(75) Inventor: Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 1047 days.

(21) Appl. No.: 11/750,959

(22) Filed: May 18, 2007

(65) Prior Publication Data

US 2008/0285698 A1    Nov. 20, 2008

(51) Int. Cl.
*G06F 1/02* (2006.01)
(52) U.S. Cl. ......................................... 708/271
(58) Field of Classification Search ........... 708/270–277
See application file for complete search history.

(56) References Cited

U.S. PATENT DOCUMENTS

| | | | | |
|---|---|---|---|---|
| 5,517,529 A | * | 5/1996 | Stehlik | 708/313 |
| 5,585,802 A | * | 12/1996 | Cabler et al. | 708/313 |
| 5,619,535 A | * | 4/1997 | Alvarez, Jr. | 708/491 |
| 5,931,891 A | * | 8/1999 | Landry | 708/271 |
| 6,185,594 B1 | * | 2/2001 | Hilton et al. | 708/270 |
| 7,064,616 B2 | * | 6/2006 | Reichert | 708/271 |
| 7,716,268 B2 | * | 5/2010 | Dobbek et al. | 708/270 |
| 2008/0005213 A1 | * | 1/2008 | Holtzman | 708/276 |

* cited by examiner

*Primary Examiner* — Chat C Do
(74) *Attorney, Agent, or Firm* — Haynes Beffel & Wolfeld LLP; Ernest J. Beffel, Jr.

(57) ABSTRACT

An opportunity is apparent to develop alternative circuitry. Simplified circuitry without artifacts tied to the clock that drives a digital frequency generator (DFG) is useful in a variety of tunable electronic devices. The present invention relates to digital frequency generation. In particular, it relates to a method and apparatus for the digital generation of a pulse stream having a desired frequency relative to a reference clock signal and the ratio of two integers. The method applies generally to integers whose ratio is not an integer. The DFG as a device can be integrated onto a simple chip, without need for an off-chip filter.

20 Claims, 12 Drawing Sheets

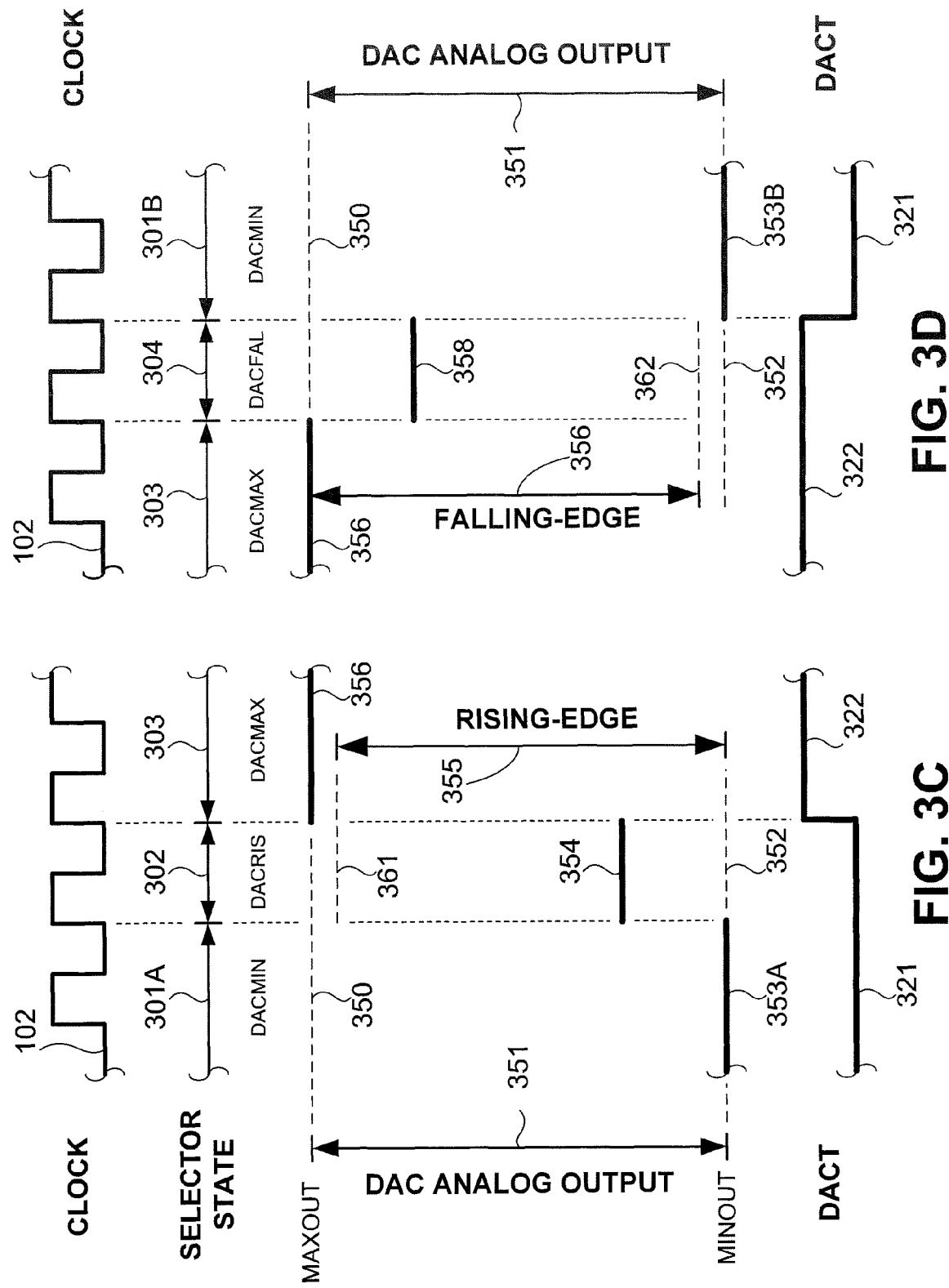

DIGITAL FORCED OSCILLATION BY DIRECT DIGITAL SYNTHESIS

BACKGROUND OF THE INVENTION

The present invention relates to digital frequency generation. In particular, it relates to a method and apparatus for the digital generation of a pulse stream having a desired frequency relative to a reference clock signal and the ratio of two integers. The method applies generally to integers whose ratio is not an integer. The digital frequency generation (DFG) as a device can be integrated onto a simple chip, without need for an off-chip filter.

A number of techniques are used to synthesize signals in the art of direct digital synthesis. Many of these techniques utilize an accumulator to access a sine wave look-up table stored in a memory, which in turn produces a sequence of values representing a sine wave at the desired frequency. Using a digital-to-analog converter (DAC), the sequence of sine wave values is converted to an analog voltage and then passed through a low-pass filter to produce an analog voltage sine wave signal with the desired output frequency. This form of direct digital synthesis provides accurate control of the generation of signals over a wide range of frequencies. Significant portions of its circuitry can be manufactured using integrated circuits. Jones discloses an example of this type of system in U.S. Pat. No. 3,958,191 and Kovalick et al. discloses an accumulator and lookup ROM in U.S. Pat. No. 5,084,681.

In spite of its many advantages, this first method of direct digital synthesis has drawbacks, including the need for a fast high-resolution DAC and a multi-pole low-pass filter requiring precision discrete components. Consequently, the DAC and filter add size and cost to a product because they usually require components external to other integrated circuits.

A second type of direct digital synthesis uses the accumulator carry signal and remainder value to generate an output frequency without requiring a lookup sine table and a low-pass filter. In U.S. Pat. No. 5,195,044, Wischermann discloses an example of this type of system, wherein the carry signal generates an output pulse after a delay that is computed from the value remaining in the accumulator when carry signals an overflow. Like the first type, this second type of system generates an output frequency with a desired fractional relationship to the input reference clock, and it also requires multi-pole filters with physical components external to an integrated circuit. This second type of circuit uses an approximation when computing the carry signal delay, which in turn reduces the accuracy of the output frequency.

An opportunity is apparent to develop alternative digital frequency generator (DFG) circuitry. Simplified circuitry without artifacts tied to the clock that drives the DFG is useful in a variety of tunable electronic devices.

SUMMARY OF THE INVENTION

The present invention relates to digital frequency generation. In particular, it relates to a method and apparatus for the digital generation of a pulse stream having a desired frequency relative to a reference clock signal and the ratio of two integers. The method applies generally to integers whose ratio is not an integer. The digital frequency generation (DFG) as a device can be integrated onto a simple chip, without need for an off-chip filter. Particular aspects of the present invention are described in the claims, specification and drawings.

BRIEF DESCRIPTION OF THE DRAWINGS

FIGS. 3A-3D are timing diagrams illustrating the relative values of the selector output signal in relationship to the operational state of the selector function.

FIG. 11A is a simulation of a waveform that is output by the digital-to-analog converter and input to the filter. FIG. 11B is a simulation of a waveform that is output by the filter, responsive to the input in FIG. 11A.

FIG. 13A is a simulation of a waveform that is output by the filter. FIG. 13B is a simulation of a waveform that is output by the comparator.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

The technology disclosed pertains to direct digital synthesis methods and apparatus that provide for the generation of an output frequency $F_{OUT}$ from an input clock signal reference $F_{CLK}$ and an integral ratio $$\frac{N}{M},$$

where N and M are integers further discussed below and $F_{OUT}$ is defined by the following formula:

$$F_{OUT} = \left(\frac{1}{2}\right)\left(\frac{N}{M}\right)F_{CLK} \tag{0.1}$$

In certain embodiments, the denominator M is an integer defined by the range of an accumulator. For example, M may be embodied by an m-bit digital accumulator of whose output ACC counts over the following range:

$$0 \leq ACC \leq (2^m - 1) \tag{0.2}$$

In those embodiments where denominator M is implemented as an m-bit digital accumulator ACC, numerator N is an integer that may also be termed $F_{SEL}$, and whose value may be repeatedly added to the accumulator. Furthermore, $F_{SEL}$ may be defined to have the following range:

$$0 \leq F_{SEL} < 2^{m-1} \tag{0.3}$$

Consequently, for those embodiments where M is implemented as an m-bit digital accumulator and $F_{SEL}$ is an integer input repeatedly added to the accumulator, the output frequency of the direct digital synthesis disclosed is defined by the formula:

$$F_{OUT} = \left(\frac{1}{2}\right)\left(\frac{F_{SHL}}{2^m}\right) F_{CLK} \qquad (0.4)$$

Substitution of the minimum and maximum $F_{SEL}$ values from equation (1.3) into equation (1.4) shows these embodiments have the following output frequency range:

$$0 \le F_{OUT} \le \left(\frac{1}{4}\right) F_{CLK} \qquad (0.5)$$

Depending on the embodiment, practical implementations of an accumulator may treat the numerator as fixed and vary the denominator or may treat the denominator as fixed and vary the numerator. Less efficient implementations may vary both the numerator and denominator. Alternative accumulator embodiments are discussed below.

Figure 1:
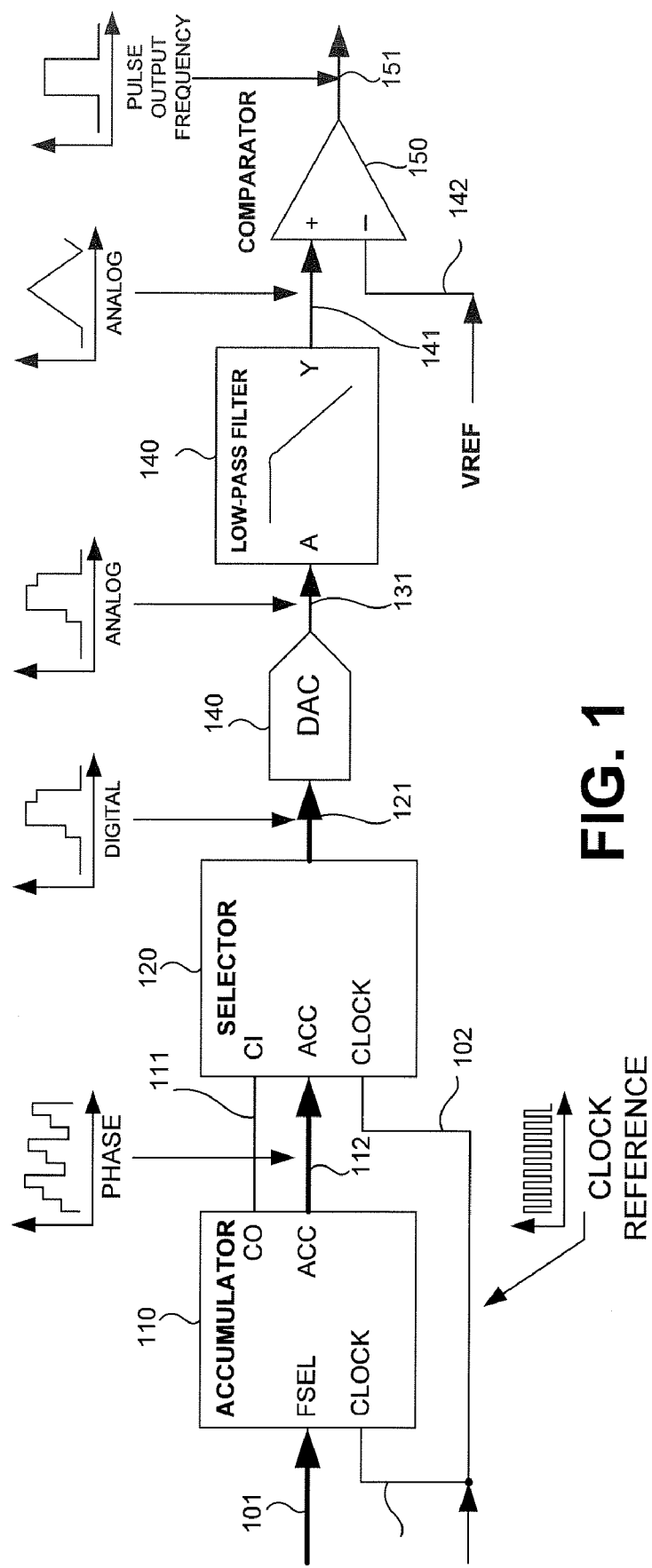
FIG. 1 is a block diagram of a direct digital frequency synthesizer (DDFS) or digital frequency generator (DFG).

FIG. 1 is a block diagram of a direct digital frequency synthesizer (DDFS) or digital frequency generator (DFG). The components include an accumulator 110, a selector 120, a digital to analog converter (DAC) 130, a low pass filter 140 and a comparator 150. Inputs to the accumulator include a frequency selector signal 101 and a reference clock 102. Outputs from the accumulator component include a carry out signal 111 and an accumulator value signal 112, both of which are coupled as inputs to the selector 120. A variety of accumulator embodiments are described below. The selector 120 also operates at the speed of the reference clock. Outputs 121 of the selector 120 are digital signals, such as voltage or current signals (current mode logic.) The outputs are coupled to a digital-to-analog converter 130. The outputs are a value and rising/falling edge indicator, as depicted in FIG. 3A.

Figure 2:
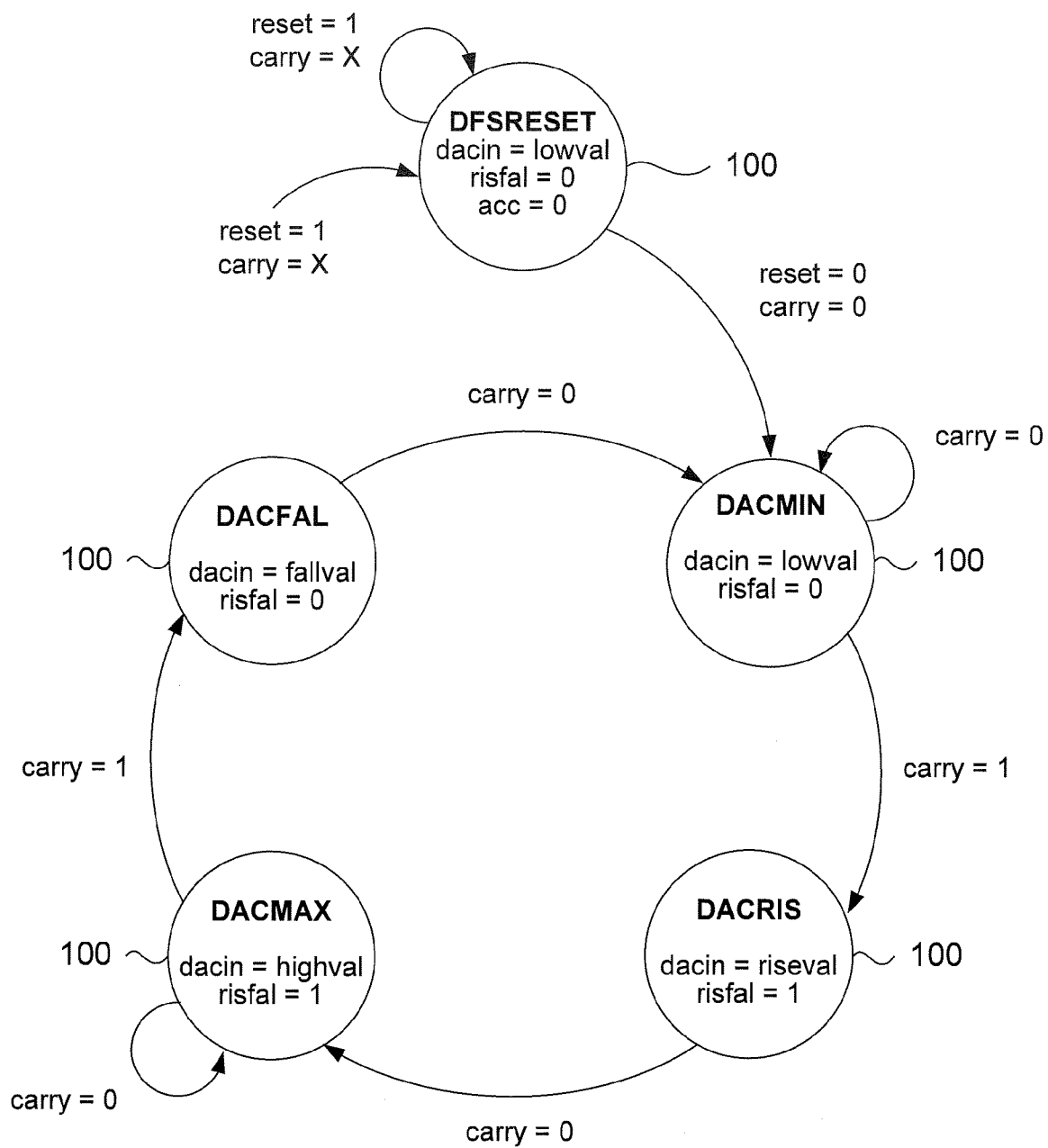
FIG. 2 is a state diagram illustrating the operation of the selector function.
Figure 3B:
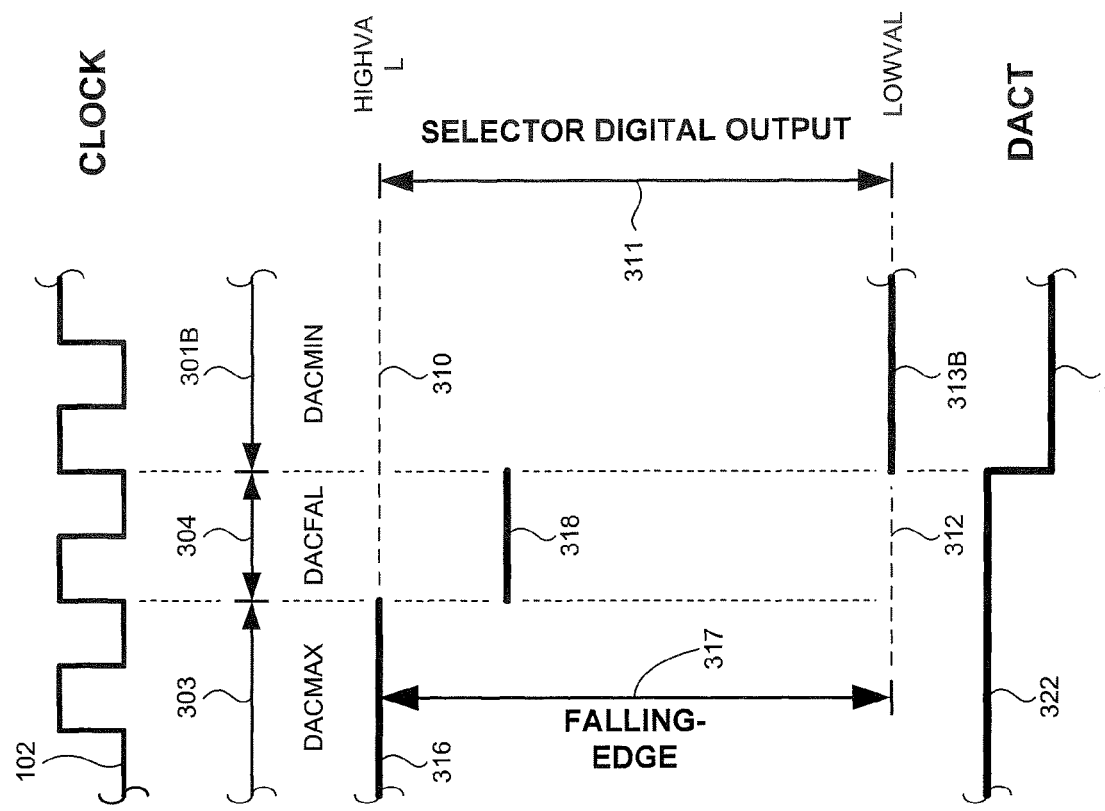
Figure 3A:
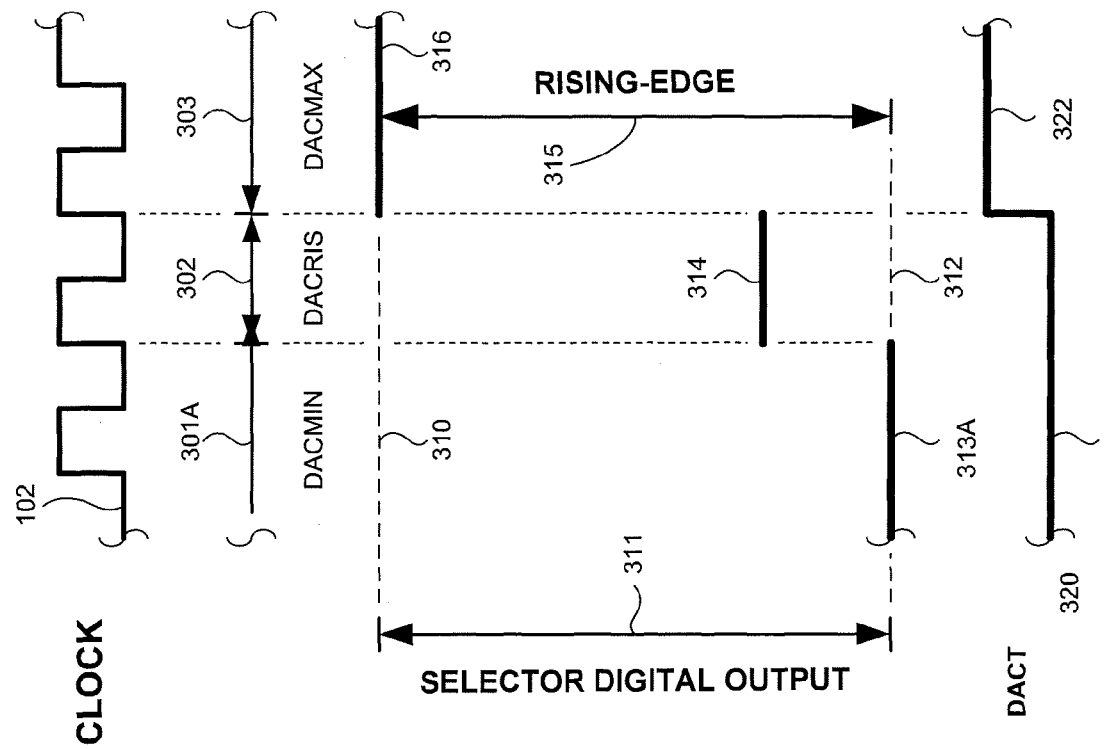

FIGS. 3A-3D are timing diagrams illustrating the relative values of the selector output signal in relationship to the operational state of the selector function. FIG. 3A indicates the clock, selector state, selector digital value and the rising/falling edge indicator of the selector 120 and at the selector output 121, as the selector changes from a rising edge to a falling edge state. The reference clock 102, at the top of FIG. 3A, is an input to the selector 120. The selector state alternates among minimum value (DACMIN) 301A, 301B, rising value (DACRIS) 302, maximum value (DACMAX) 303, and falling value (DACFAL) 304, with corresponding outputs. More details of the selector state progression are explained below in the context of FIG. 2. The output signals 121 include both a digital value 311 and an indicator (DACT) 320 of whether the signal edge is rising 321 or falling 322. The selector digital value output 311 has the same range between a low 313 and high value 316, whether the digital value corresponds to a rising edge 315 or a falling edge 317. The interpretation of the digital value by the DAC 130 depends on whether the signal is rising or falling.

In FIG. 3A, the first two outputs of the selector are a low value 313 and a rising intermediate value 314, both while the edge is rising. The low value is for one or more clock periods 301A. The intermediate value is for a single clock period 302. Then, the state shifts to falling edge 322 and a high value signal 316 is output for one or more clock periods 303.

In FIG. 3B, the first two outputs are a continuing high value 316 and a falling intermediate value 318. Like the low value, the high value signal 316 lasts one or more clock periods. The rising and falling intermediate values are for one clock period. At the end of FIG. 3B, the digital value output returns to the low value 313. Returning to FIG. 1, the selector output 121 is indicated by a digital output signal.

FIG. 1 includes a DAC coupled to the selector. As FIGS. 3A-3B indicate, the DAC receives a pair of signals. Its response depends on the combination of signals. (One of skill in the art will recognize that the signals could be combined by various encodings without changing the principle of operation.)

FIGS. 3C-D indicate the output of the DAC, along the same time line as FIGS. 3A-B indicate its input. Notice that the range of rising edge outputs 355 is offset from the range of falling edge outputs 356. The subtle difference between inputs and outputs to the DAC is an offset between the maximum output of the DAC 350 and the greatest intermediate output 361 corresponding to the rising intermediate digital value 314. Aligned with the rising/falling value indicator 321, 322, when the edge is rising 321, a rising intermediate digital value 314 is processed by the DAC 130. The highest value 310 of the rising intermediate value 314 causes the DAC to generate an output 361 that is less than the maximum DAC output 350. Similarly, the lowest value 362 output by the DAC in response to a falling intermediate digital value 318 is greater than the minimum DAC output 352. Returning to FIG. 1, the DAC output 131 is indicated as an analog signal with a similar form to the digital input, modified by the offset.

FIG. 1 further includes a low-pass filter. In some embodiments, the time constant of the low-pass filter or the band-pass point, the cutoff frequency of the low pass filter is selected to be roughly half of the reference clock, to eliminate high frequency components of the analog output. It is understood from Fourier analysis that harmonic components of the analog output will in the general case be odd harmonic multiples of the desired output frequency, 3f, 5f, 7f etc. where f is the output frequency of the intended signal, the desired output clock. The low pass filter is designed to pass the desired signal, which has a period of 4 clock cycles or greater, but not the higher frequency harmonics or the reference clock frequency. The output 141 of the low-pass filter 140 is a filtered analog signal, which can be presented to a comparator 150.

The comparator 150 changes the rising and falling analog signal 141 into a digital pulse (FOUT) 151 having the desired frequency. A reference input 142 governs the comparator. A useful property of this approach to DFG is that the pulse output frequency 151 need not be aligned with any pulse of the clock reference 102.

One of skill in the art will recognize that by adjusting a value in the accumulator, either a starting value or an intermediate value, an offset can be introduced to align FOUT 151 with an external signal of similar frequency.

FIG. 2 is a state diagram that generally describes the state of the selector 120. Other than the reset state (DFSRESET) 200, the state flow progresses among four states 210, 220, 230, 240, which correspond to states 301-04 in FIGS. 3A-D. The selector enters the reset state 200 upon assertion of a reset signal 211. As long as the reset signal remains asserted 202, the reset state 200 will be in effect. Deassertion 203 of the reset signal will correspond to a negative initial carry indicator, because the accumulator resets during the reset state. Deassertion 203 causes a transition to a first state, which is illustrated in this state diagram as DACMIN 210. The DACMIN state 210 produces a minimum digital output value from the selector (313A in FIG. 3A) which is held throughout this state. It also produces a rising edge signal (321 FIG. 3A). The state continues 211 until the accumulator generates a carry signal. When the selector receives the carry signal, a state transition 212 takes place.

Following DACMIN is the rising edge (DACRIS) state 220. This state preferably lasts one clock cycle. When the accumulator generates a carry signal, it also generates a so-called remainder which is a value between 0 and N−1, where N is the numerator in equation 1.1, above. During DACRIS, the remainder value is output as the rising intermediate value (314 in FIG. 3A) and the rising edge signal 321 is in effect. The carry signal is deasserted 221 in the clock cycle after it is asserted 212, corresponding to the next state transition.

The DACMAX state 230, produces a maximum digital output value (316 in FIG. 3A) which is held throughout this state. It also produces a rising edge signal (322 FIG. 3A). The state continues 231 until the accumulator generates a carry signal. When the selector receives the carry signal, a state transition 232 takes place.

Following DACMAX is the falling edge (DACFAL) state 240. This state preferably lasts one clock cycle. When the accumulator generates a carry signal, it also generates a so-called remainder which is a value between 0 and N−1, where N is the numerator in equation 1.1, above. During DACFAL, the ones complement of the remainder value is output as the falling intermediate value (318 in FIG. 3B) and the falling edge signal 322 is in effect. The carry signal is deasserted 241 in the clock cycle after it is asserted 232, corresponding to the next state transition, which returns the state cycle to DACMIN 210.

To remind the reader how ones' complement is implemented, consider the following table excerpt:

| Decimal | Binary | Ones' Complement |
|---|---|---|
| +15 | 1111 | 0000 |
| +14 | 1110 | 0001 |
| +13 | 1101 | 0010 |
| +12 | 1100 | 0011 |
| +11 | 1011 | 0100 |
| +10 | 1010 | 0101 |
| +9 | 1001 | 0110 |

On a rising edge, a large remainder from the accumulator and a corresponding large rising intermediate value signals a desired analog output from the DAC that is near the maximum. On a falling edge, a large remainder signals a desired output from the DAC near the minimum output. A ones' complement of the remainder combined with an offset corresponding to the rising/falling edge indicator 320 is one embodiment of providing the appropriate to the DAC.

Note that the range of the remainder can be larger than the precision of the DAC. The DAC can, for instance, take into account just the most significant digits of the remainder or the ones' complement of the remainder.

In operation, at least four cycles of the reference clock 102 are required for the system to cycle through four states, 210, 220, 230 and 240. Therefore, the frequency of a DGF signal FOUT 151 is one-quarter or less than the reference clock frequency 102. Conversely, the period of the FOUT signal is at least four times the period of the reference clock period.

The overflow and remainder of the accumulator can be thought of as implementing modulo arithmetic. The modulo base is the denominator. The remainder ranges from zero to one less than the numerator ($0 <= R < N$). It works out nicely if the numerator is an integer power of $2 (N=2k)$. The design of the accumulator and of the DAC both can benefit from a well-chosen numerator, but the technology disclosed can be practiced with most any choice of numerator and denominator that is consistent with a four state cycle (i.e., $½N/M<=¼$). The advantage of a well-chosen numerator emerges as we consider alternative embodiments of the accumulator 110**.

The number of cycles in which the state machine remains at DACMIN or DACMAX will fluctuate by one cycle. The following table with a sample numerator of four and denominator of 17 illustrates this fluctuation:

| Accumulated | Mod 17 | Terminal | Ratio |
|---|---|---|---|
| 0 | 0 | TC | 0 |
| 4 | 4 | | |
| 8 | 8 | | |
| 12 | 12 | | |
| 16 | 16 | | |
| 20 | 3 | TC | 0.75 |
| 24 | 7 | | |
| 28 | 11 | | |
| 32 | 15 | | |
| 36 | 2 | TC | 0.5 |
| 40 | 6 | | |
| 44 | 10 | | |
| 48 | 14 | | |
| 52 | 1 | TC | 0.25 |
| 56 | 5 | | |
| 60 | 9 | | |
| 64 | 13 | | |
| 68 | 0 | TC | 0 |
| 72 | 4 | | |
| 76 | 8 | | |
| 80 | 12 | | |
| 84 | 16 | | |
| 88 | 3 | TC | 0.75 |

The accumulated column adds the numerator (four) to the prior total. The mod 17 column translates the accumulated value by modular or clock arithmetic into a modulo denominator (17) value. The terminal condition column indicates when the modulo 17 value has clocked past 16. The ratio column indicates the ratio of the remainder at the terminal condition to the numerator. In some ranges of rows, it takes five iterations to overflow the accumulator. In other ranges, it takes four iterations. The number of iterations depends on whether the accumulator starts with zero or with a non-zero remainder from the prior overflow. The overflow remainder depends on the prior overflow remainder. Equivalent result patterns are generated by the illustrated up counter that accumulates a positive numerator or a down counter that accumulates a negative numerator. Alternatively, this result pattern can be produced using a pseudo-random binary sequence shift register with a selected starting symbol and calculating the change in the remainder when the terminal condition occurs, as explained below.

Figure 4:
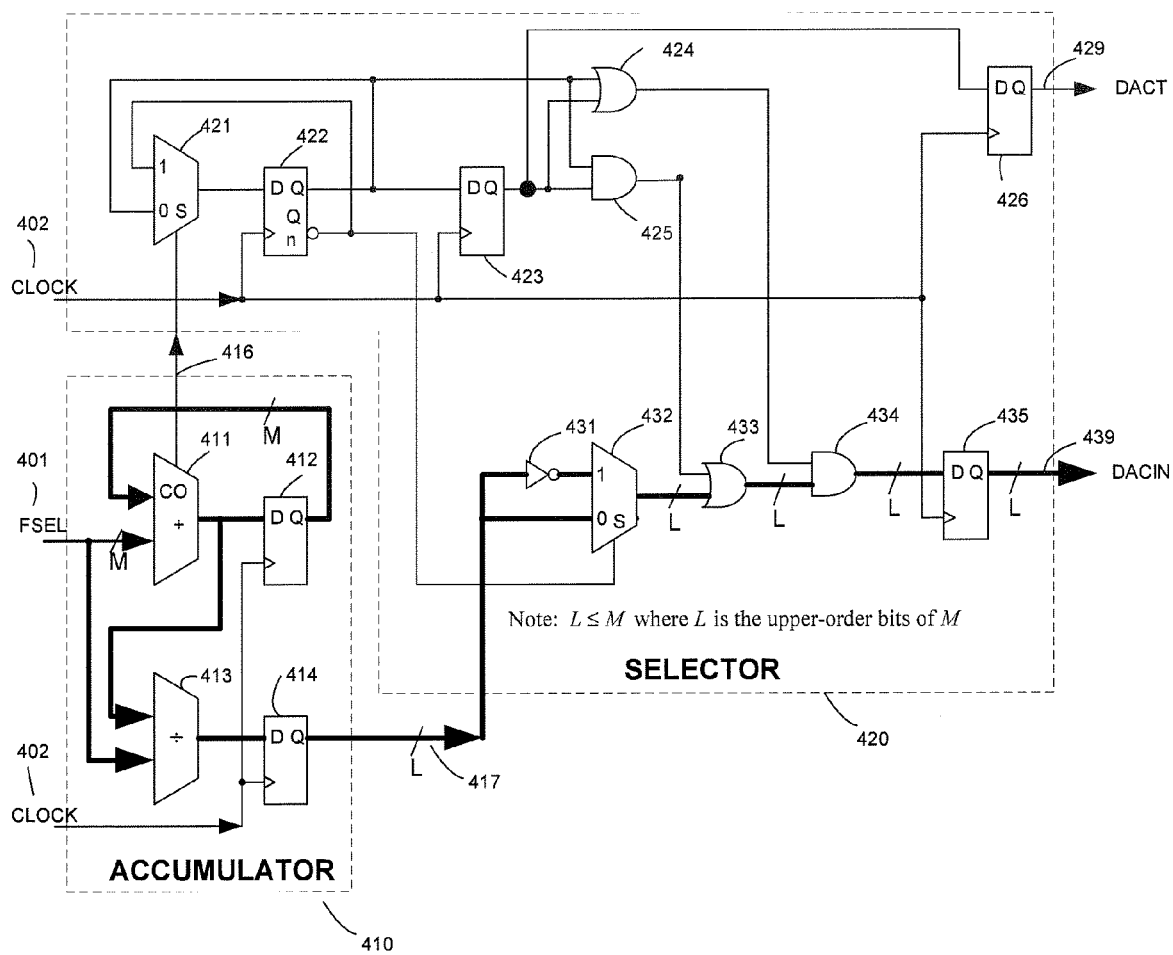
FIG. 4 is a schematic diagram of an embodiment of generic accumulator coupled to a selector.

FIG. 4 is a schematic diagram of an embodiment of a generic accumulator stage coupled to a selector. We refer to this schematic as a generic accumulator, because the divider runs relatively slowly and more efficient implementations are described below.

The accumulator 410 is coupled to the selector 420. As inputs, this accumulator has a frequency selector (FSEL) 401 and a reference clock 402. A generic interpolation generator 413, 414 is illustrated as part of the accumulator. Not explicitly illustrated is the value at which the accumulator component 411 overflows, generating the carry/overflow signal 416. In the formulas above, FSEL 401 corresponds to N in the numerator and the value at which the accumulator overflows corresponds to M in the denominator. The accumulator 411 adds the FSEL 401 value to the previous sum that was calculated, which has been buffered 412 and is coupled back as an input to the accumulator 411. The resulting sum is stored in the buffer 412, which updates responsive to the reference clock 402.

The generic interpolation generator 413, 414 calculates the ratio of the remainder, when the carry/overflow takes place, divided by FSEL 401, the numerator N. This ratio is buffered 414 responsive to the reference clock 402 and output 417 to the selector 420. When the numerator is an integer power of 2 (N=2\*\*k), the ratio can be calculated using a shift register operation instead of a divide by operation. Or, depending on the DAC precision, a well-chosen numerator allows the remainder to be used directly to represent the ratio. It is useful to note that the divider 413 does not need to produce an output at each cycle of the reference clock 402. The calculated ratio is used only when an overflow occurs or is about to occur, which is no more than every two clock cycles, depending on how close the ratio ½N/M is to the limit of one-fourth.

Figure 5:
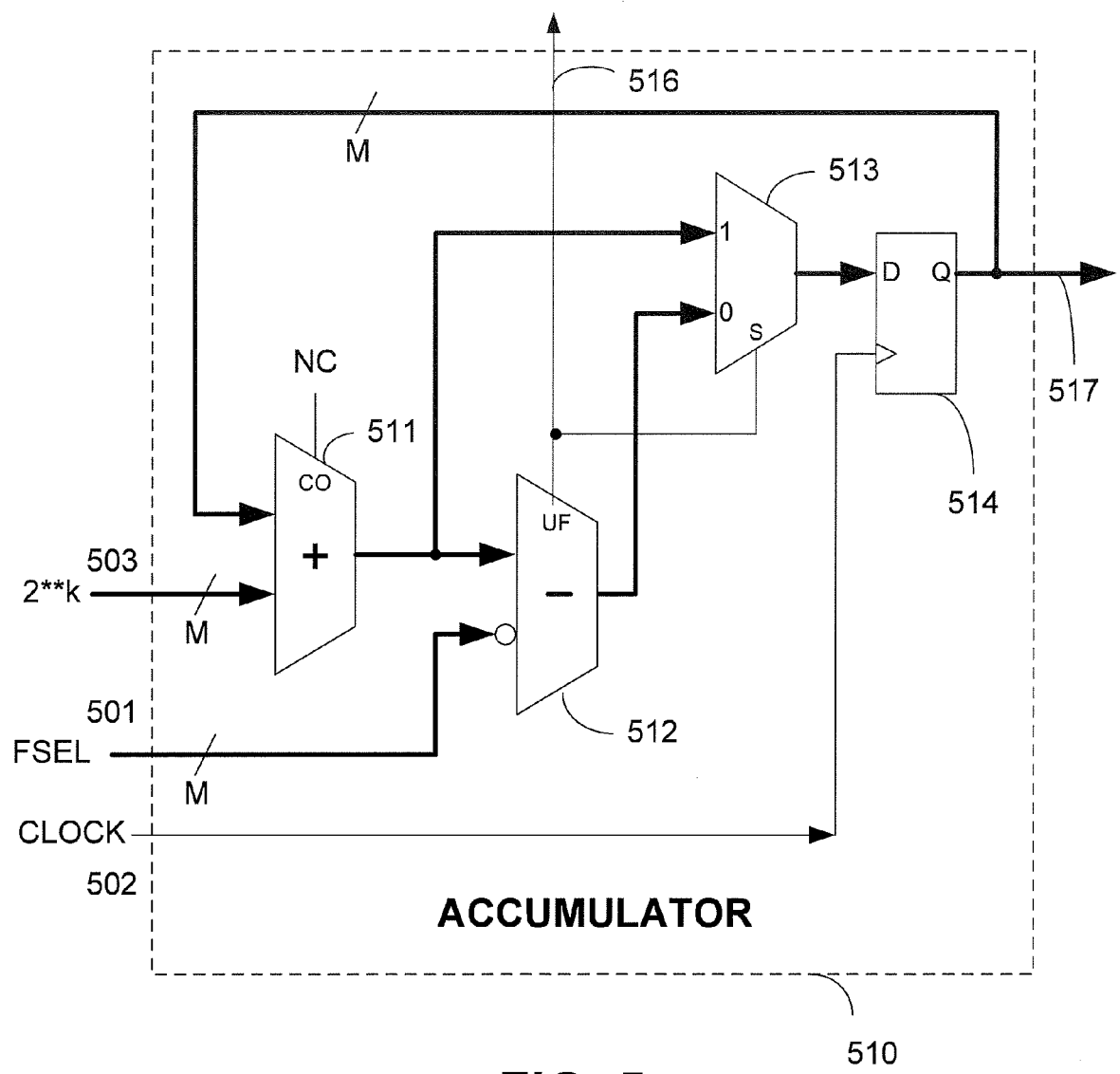
FIG. 5 is a conceptual diagram of an embodiment of the accumulator with a power of two numerators, without using a divider.

FIG. 5 is a conceptual diagram of an embodiment of the accumulator with a power of two numerator, without using a divider. A down counter is implemented with a subtracter 512 that counts down from the value of the denominator M−1 and underflows when it passes zero. Using ones complementary arithmetic to invert FSEL 501, an adder can operate as a subtracter. The underflow signal 516 is output to the selector and controls a MUX 513. The MUX 513 controls whether the output of the fast down counter 512 or the output of the adder 511 is clocked into the buffer 514. The output of adder 511 is used less frequently than the output of the fast down counter 512, because the limit for the generated frequency is one quarter of the reference clock. A fast down counter can be implemented, for instance, using a PRBS shift register.

Figure 6:
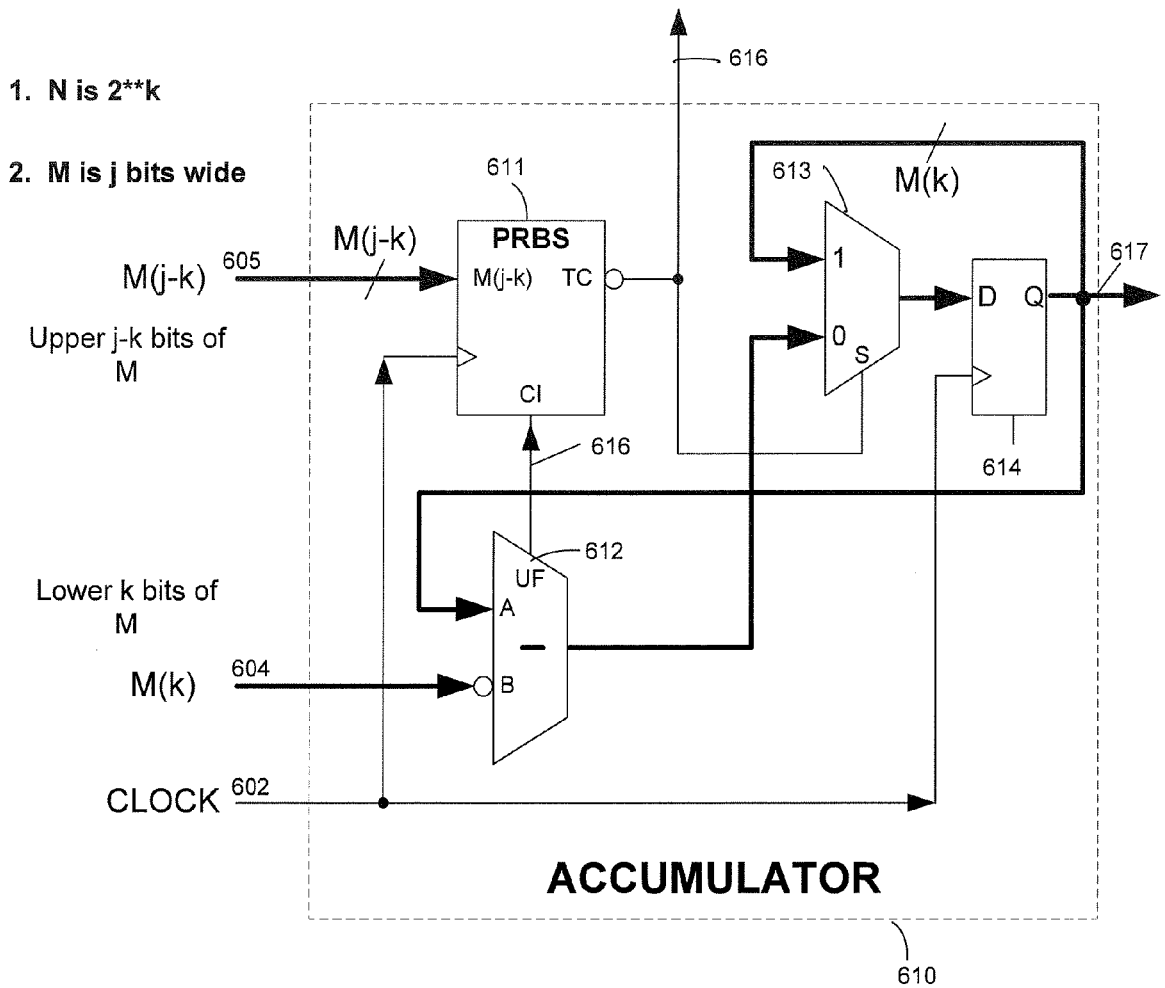
FIG. 6 depicts using a pseudo random binary sequency (PRBS) shift register to implement a fast down counter, instead of using a subtracter.

FIG. 6 depicts using a pseudo-random binary sequence (PRBS) shift register to implement a fast down counter, instead of using a subtracter. A PRBS is a sequence of symbols that can be calculated from a starting symbol and that reaches a terminal condition (TC) in a known number of steps. A PRBS can be chosen so that the next to last and last (TC) symbols are easily detected, for instance binary 1 and 0. A down counter can be replaced by a PRBS shift register if the number of elements is known and the appropriate starting symbol is chosen. For a given length of sequence, the appropriate symbol can be looked up and used as a starting point for calculating successive symbols. For instance, if the desired sequence length is 21 symbols, selecting the twenty-first symbol and processing the sequence. A micro-controller looks up the value to be loaded into the PRBS. The desired length of the sequence 605, for a numerator of N=2\*\*k, is found in the high order bits of the denominator, the j-k high order bits, where j is the bus width that carries the denominator value. In some embodiments, the numerator may be configurable, that is, the value k can vary and be configurable. When the numerator is configurable, it may be necessary to use overly wide data paths, to accommodate the maximum values of numerator and denominator allowable.

A difference between using a PRBS shift register and a subtracter to count down is that the symbol-to-symbol transitions of a PRBS require less time to calculate. Compare subtracting N from M. The subtraction involves an arbitrary number of bit carries that must, to some degree, be executed sequentially. A linear feedback shift register, for instance, can be implemented without any bit carries. In the seven state sequence of 001, 100, 010, 101, 110, 111 and 011, the next symbol can be generated by adding without overflow or XORing the two low order bits and shifting the result into the high order bit position. For symbol 010, the two low order bits combine to generate a "1", which becomes the high order bit of the next symbol. The two high order bits become the low order bits. The low order bit of "010" shifts out of the sequence. The result is symbol 101.

Figure 7:
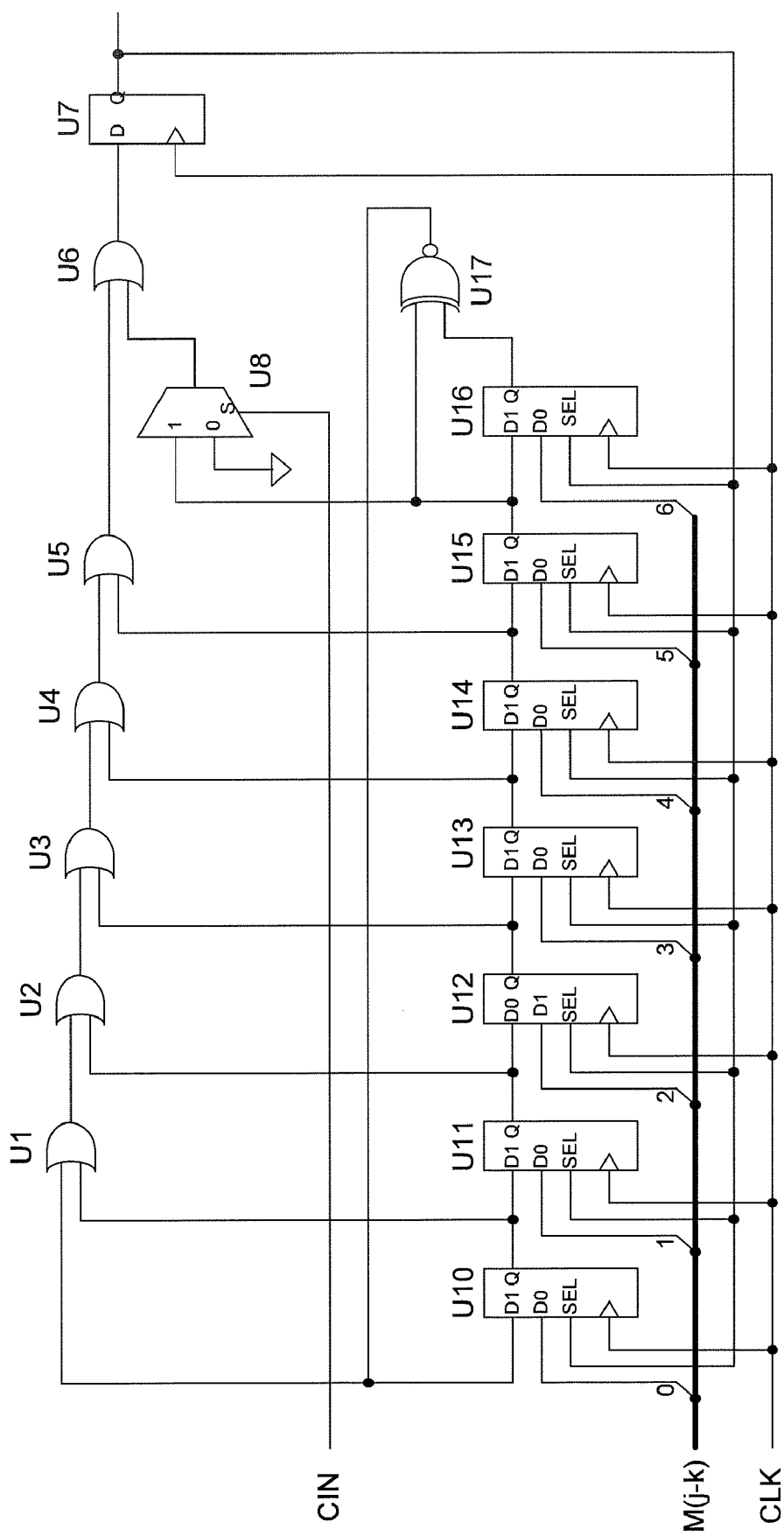
FIG. 7 illustrates a PRBS shift register embodiment.

FIG. 7 illustrates a PRBS shift register embodiment, but any PRBS embodiment can be used, preferably a fast implementation. The seven single bit registers illustrated handle up to 128 symbols, for a relatively long sequence. More or fewer bits can be implemented. Logic other than the indicated not-XOR of bits from registers U15 and U16 can be applied to reset the high order bit in U10. To use the PRBS as a fast down counter with an arbitrary sequence length, a long sequence should be available, the starting symbol is loaded initially and reloaded when the desired end of the sequence is reached. It also is useful to be able to detect both the last and next-to-last symbols in the sequence.

Returning to FIG. 6, the combination of the MUX 613 and register 614 recycle a value that is unchanging, except when the terminal condition (TC) occurs. When the inverted terminal condition signal 616 indicates that the end of the down count has been reached, the signal causes the MUX 613 to select the output of the subtracter 612 to update the buffer 614 with a new value. The shortest PRBS length is two symbols and longer sequences are likely. Even a two-symbol sequence gives the subtracter extra time to settle and generate output that can be buffered through the MUX into the register 614. Note that the under flow signal from the subtracter 616 is coupled to the carry indicator of the PRBS 611. Looking to FIG. 7, one sees that the carry indicator (CIN) signal controls whether the PRBS reports out the last symbol or the next-to-last symbol as the TC. This is because a sequence of remainders occasional produces an underflow, as illustrated above, the length of the DACRIS 220 or DACFAL 240 state is responsive to the remainder underflow or overflow.

Returning to FIG. 4, the selector 420 includes various components with a state machine and outputs that can be summarized with reference to the states in FIG. 2:

| State Name and Ref | State Registers | DACT Output | DACIN Output |
|---|---|---|---|
| DACMIN 210 | 00 | 0 | All Zeroes |
| DACRISE 220 | 10 | 0 | Remainder |
| DACMAX 230 | 11 | 1 | All Ones |
| DACFALL 240 | 01 | 1 | Remainder Ones' Comp. |

Registers 422 and 423 are state registers. The output indicator of a rising or falling edge (DACT for DAC trigger) 429 controls an offset applied by the DAC 130, as indicated in FIGS. 3A-D. The output value (DACIN for DAC input) 439 is as indicated. Updating of the state registers on the reference clock 402 is responsive to the carry out signal 416 from the accumulator 410, which is processed by a MUX 421. The state of register 422 represents the high order bit in the table above, which determines whether the reminder value 417 or an inverted 431 version of the reminder value (e.g., a ones' complement) is selected 432 to be buffered 435 and output 439. The state of register 423 represents the low order bit in the table above, which determines the offset applied by the DAC in conversion. The logic components 424, 425, 433, 434 combine to generate the buffered output 435 to ones or all zeros in the DACMIN and DACMAX states.

Implementation of the DAC 130 is best summarized by its transfer function, as a variation on an R−2R resistor ladder or any other DAC, preferably low cost, can be used. The transfer function is controlled by the signal DACT, which is illustrated in FIGS. 3C-D. It may be thought of as applying an affect, depending on the signal DACT. Alternatively, a digital value may be implemented, responsive to the value of DACT. Or, DACT could be treated as the lowest order bit of the value to be converted.

| DAC Input Decimal | DAC Input Binary | DAC Output DACT = 0 | DAC Output DACT = 1 |
|---|---|---|---|
| 15 | 1111 | 15/16 | 1 |
| 14 | 1110 | 7/8 | 15/16 |
| 13 | 1101 | 13/16 | 7/8 |
| 12 | 1100 | 3/4 | 13/16 |
| 11 | 1011 | 11/16 | 3/4 |
| 10 | 1010 | 5/8 | 11/16 |
| 9 | 1001 | 9/16 | 5/8 |
| 8 | 1000 | 1/2 | 9/16 |
| 7 | 0111 | 7/16 | 1/2 |
| 6 | 0110 | 3/8 | 7/16 |
| 5 | 0101 | 5/16 | 3/8 |
| 4 | 0100 | 1/4 | 5/16 |
| 3 | 0011 | 3/16 | 1/4 |
| 2 | 0010 | 1/8 | 3/16 |
| 1 | 0001 | 1/16 | 1/8 |
| 0 | 0000 | 0 | 1/16 |

This transfer function has been simulated and proven to produce low jitter or noise in the digitally generated frequency output.

Figure 8:
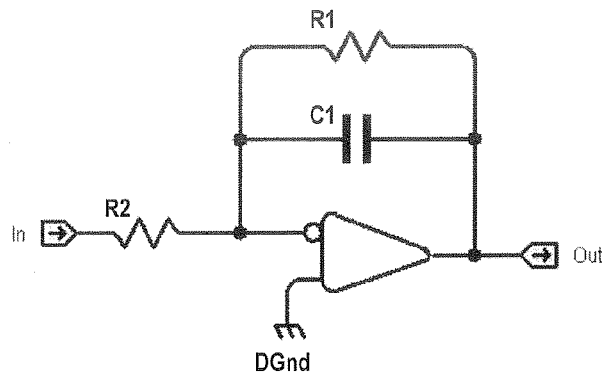
FIG. 8 depicts a simple low pass filter.
Figure 9:
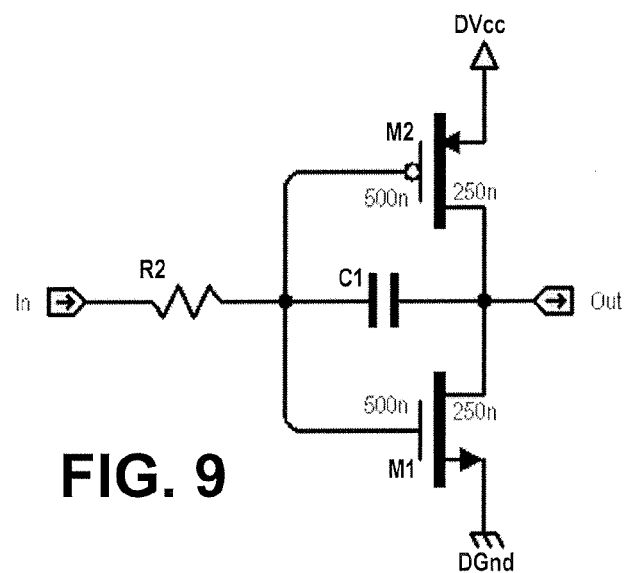
FIGS. 9-10 depict more elaborate low pass filters.
Figure 10:
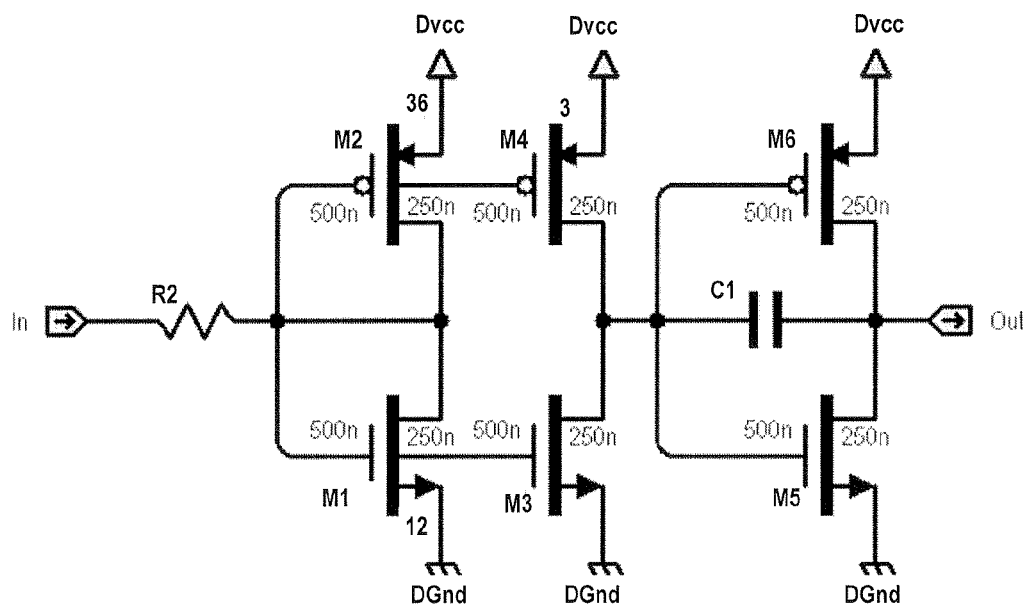

FIG. 8 depicts a simple low pass filter. FIGS. 9-10 depict more elaborate low pass filters. The desired transfer function is graphically illustrated in FIGS. 11A-B. Other forms of low pass filter or filters in general may be used to convert an analog version of the selector output into a truncated triangular waveform that presents crossing points with the desired frequency/period, a frequency that need not be aligned with the reference clock.

Figure 11A:
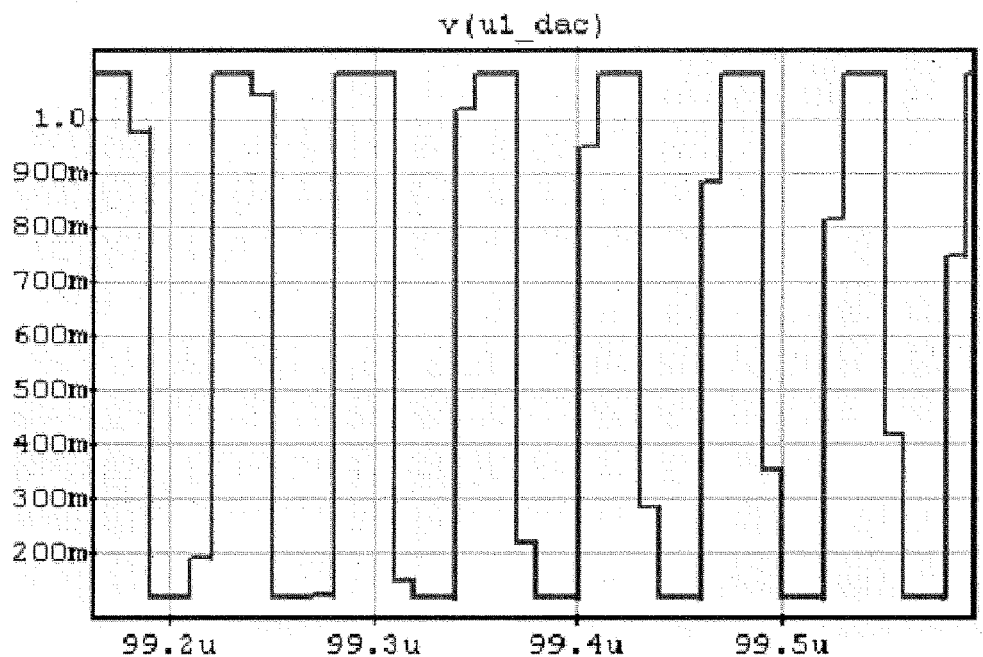
FIGS. 11A-B depict simulated results of an embodiment of this technology.
Figure 11B:
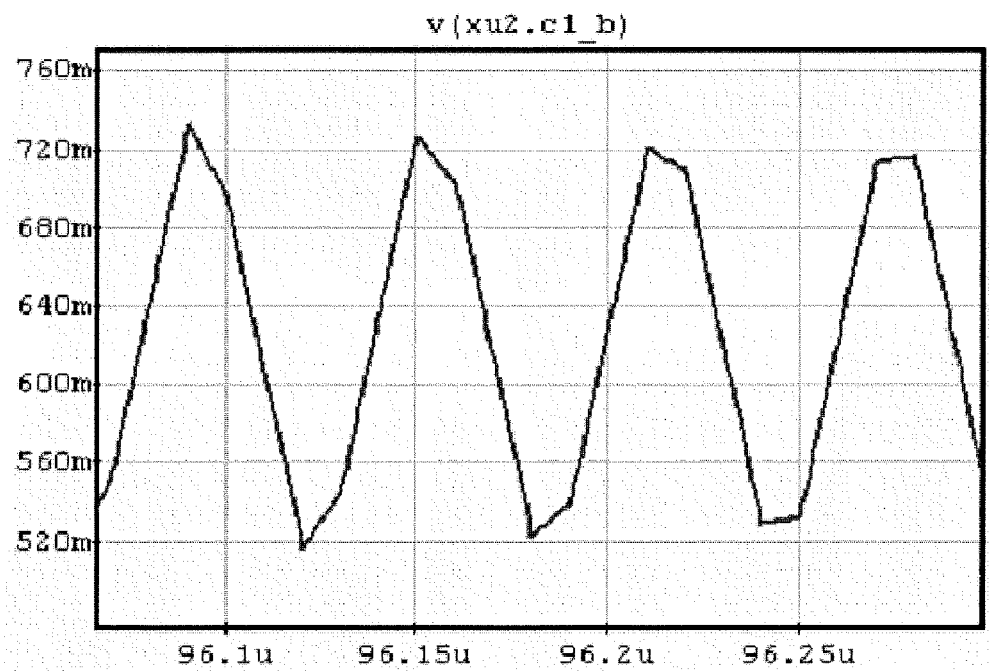

FIGS. 11A-B depict simulated results of an embodiment of this technology. FIG. 11A is a simulation of a waveform that is output by the digital-to-analog converter and input to the filter. Consistent with the modulo arithmetic example table above, a downward trend of intermediate rising values can be seen in the figure. Applying ones' complement math, a upward trend of intermediate falling values can be seen. These patterns may be cyclic. FIG. 11B is a simulation of a waveform that is output by the filter, responsive to the input in FIG. 11A. We refer to this waveform has a truncated triangular waveform because the high and low values of the waveform are limited, responsive to be range of the digital-to-analog converter. A triangular waveform would extend the longer legs of the waveform to higher highs amble or lows than depicted in the figure. A useful feature of this waveform is a consistently-spaced crossing point at or near the middle of the waveform. Even though the bends in the waveform are aligned to the reference clock, the crossing points of the filter to analog signal are essentially free of artifacts resulting from the frequency of the reference clock. The crossing points do not depend on alignment with the reference clock.

Figure 12:
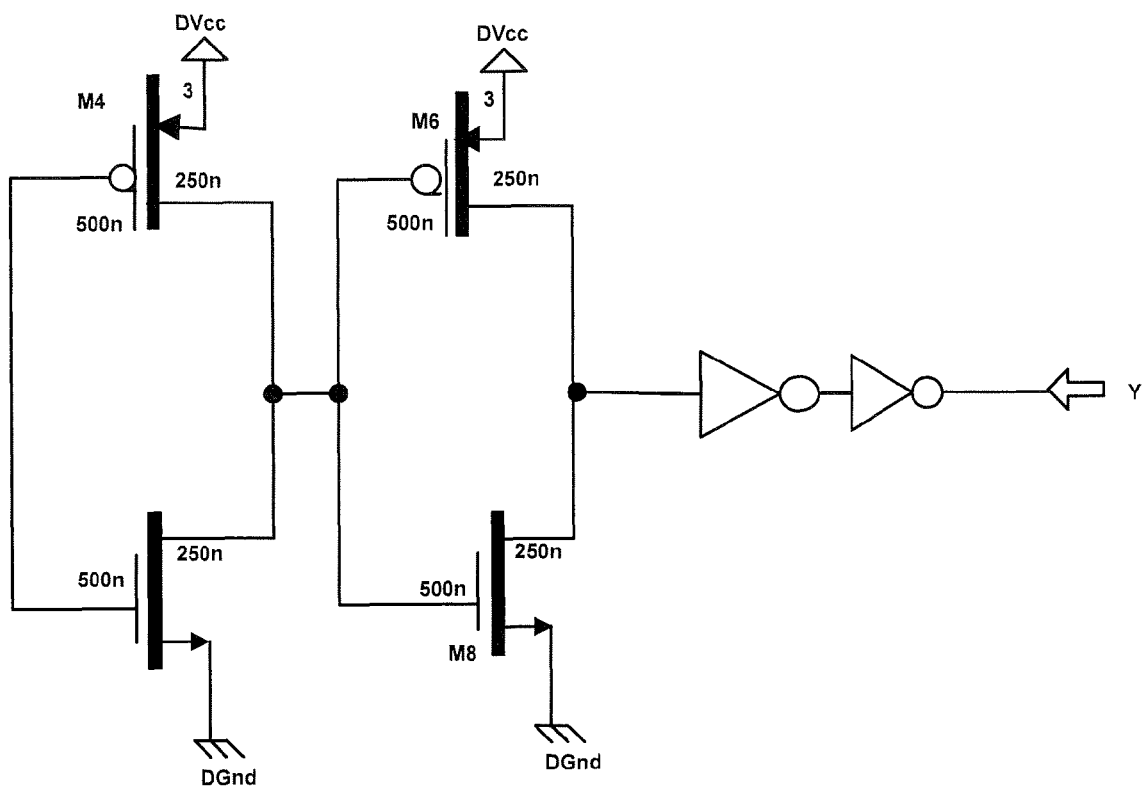
FIG. 12 depicts a comparator, which has a transfer function.

FIG. 12 depicts a comparator, which has a transfer function that is illustrated in the following figures. Any comparator may be used.

Figure 13A:
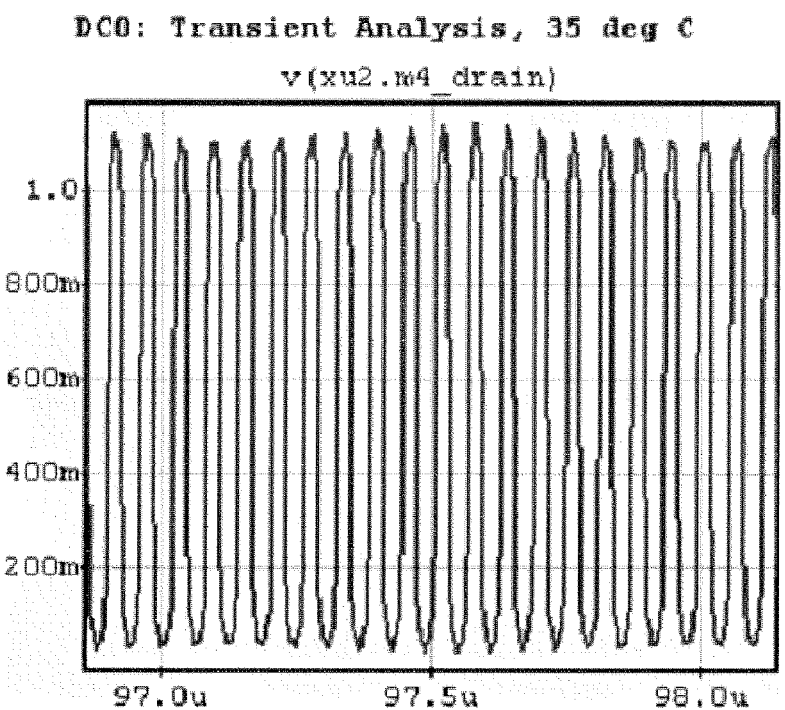
FIGS. 13A-B depict simulated results of processing the filtered analog signal through a comparator to produce a pulse stream.
Figure 13B:
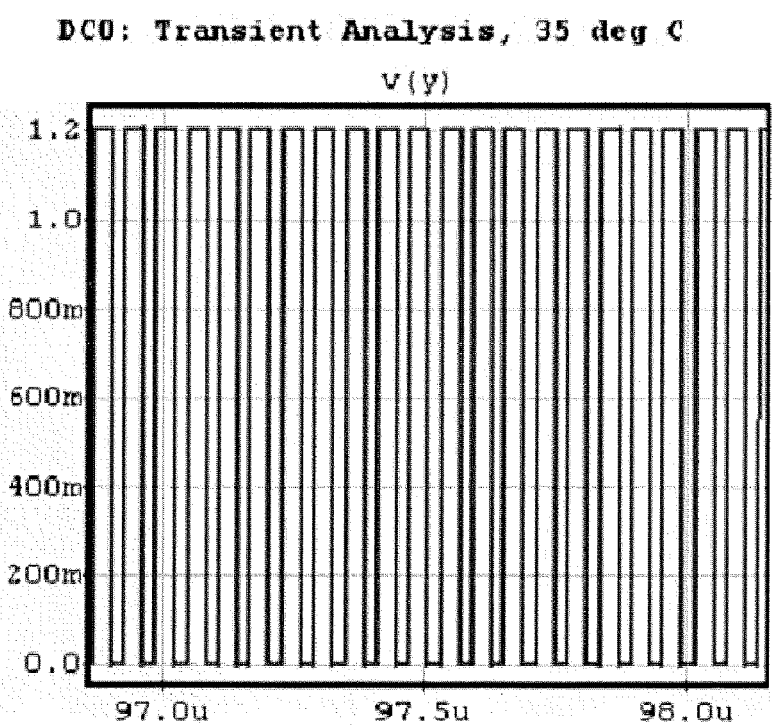

FIGS. 13A-B depict simulated results of processing the filtered analog signal through a comparator to produce a pulse stream. FIG. 13A is a simulation of a waveform that is output by the filter. It resembles FIG. 11B, with a compressed timeline. FIG. 13B is a simulation of a waveform that is output by the comparator.

Analysis and simulation of the embodiments illustrated has confirmed that this design is suitable for implementation on a single chip, integrated circuit or other device with an on-chip filter. With other designs, an on-chip filter is impractical to use because it introduces significant distortion and does not faithfully construct a sine wave from samples. Constructing a sine wave using samples from a sine wave ROM requires an off-chip filter that is more precise than practical for an on-chip filter. Recovering a sine wave typically involves using a so-called brick wall filter. In contrast, filtering the high/low values with an intermediate rising/falling value generates a truncated triangular wave instead of a sine wave. The truncated triangular wave of the designs taught here can be generated with an on-chip filter.

Some Particular Embodiments

The present invention may be practiced as a method or device adapted to practice the method. The invention may be an article of manufacture such as computer readable media impressed with logic to carry out digital frequency generation.

One embodiment is a digital frequency generator (DFG) that produces an output frequency relative to a reference clock. This device includes a reference clock signal having cycles, a numerator value or signal and a denominator value or signal. The numerator and denominator are accessible in memory. The numerator and denominator may be a value stored in memory or a signal input to the device. The device further includes at least an accumulator stage and a selector. There are several alternatives for implementing the accumulator stage, as described above. The accumulator stage could, alternatively, be implemented using a divider, an adder, a subtracter, or a pseudo-random binary sequence shift register. The accumulator stage is coupled to the reference clock, the numerator and the denominator. It iteratively signals a terminal condition signal and a remainder signal. These signals are generated after a number of cycles that it would take to reach an overflow condition by repeatedly accumulating the numerator and overflowing an accumulator that has a range from zero to the denominator minus one. As explained above, this number of cycles fluctuates by one, depending on the starting value of the accumulator, which ranges from zero to the numerator value minus one. Corresponding to when an overflow would happen, the accumulator stage outputs both a terminal condition signal and a remainder signal.

The selector stage is responsive to the accumulator stage and to both the terminal condition signal and the remainder signal. It includes a state machine and output stage. The state machine transitions, responsive to the terminal condition signal, through states such as those illustrated in FIGS. 2 and 3A-B. For instance, the states may be a low value state, a rising intermediate value state, a high-value state, and a falling immediate value state. Other names could be applied to the states, which might seem to reverse the order. Between high and low states, there will be an intermediate state, both on the rising and the falling side. In some instances, the intermediate state may be full range, that is, equal to the low value or the high value. This depends on the ratio of the numerator and denominator. The output stage outputs a value signal responsive to the state machine. For instance, it may output a low value responsive to the low value state and a rising intermediate value during the rising intermediate value state. The rising intermediate value is responsive to the remainder signal. Similarly, the output stage outputs a high value responsive to the high-value state and a falling value during the falling intermediate value state. The falling intermediate value also is responsive to the remainder signal. As explained above, it may be the one's complement of the remainder. The output stage further outputs a binary rising-or-falling signal responsive to the state machine. A rising signal may be generated during the low value state and the intermediate rising value state, as illustrated in FIG. 3A, and a falling signal may be generated during the high-value state and the intermediate falling value state, as illustrated in FIG. 3B. Alternatively, the rising signal might be generated during the intermediate rising value state and the high value state, with the falling signal generated during the intermediate falling value state and the low value state. The precise definition of the binary rising-or-falling signal will depend on the encoding of the remainder and the operation of successive stages such as digital-to-analog converter (DAC) and comparator stages. The combination of the accumulator stage and the selector produce a useful output signal that might have a variety of uses in digital processing.

The accumulator stage and selector described above may, optionally, be combined with a digital-to-analog converter, filter and comparator. The digital-to-analog converter would be coupled to the value signal and the rising-or-falling signal of the selector. It would produce an analog output responsive to the value signal with an offset responsive to the rising-or-falling signal, for instance, as illustrated in FIGS. 3A-D. The filter would process the output of the digital-to-analog converter and smooth it. Following conversion of digital value signals from the selector, the corresponding analog output of the converter could be filtered into truncated triangular waveforms. We refer to the waveforms as truncated triangles because the peaks and valleys are cut off to keep the signal within the allowable output range of the converter. The peaks and valleys would exceed the range of the converter if not truncated, at least when the truncated triangular waveforms were not aligned with an edge of the reference clock. Filters other than a low pass filter might produce different but equally useful waveforms. The desired property of the filtered waveform is to have some crossing point that can be converted into a periodic pulse stream of a desired frequency.

Embodiments of the accumulator-selector or the whole DFG will vary by whether the numerator or denominator is fixed. In some limited applications, both may be fixed. If only two frequencies are desired, for instance, two implementations of the whole DFG with fixed numerator and denominator might be built on a chip and selected alternatively. Generally, multiple DFGs may be packaged on the same chip.

In the fixed numerator embodiment, it is useful to select a numerator that is a fixed integer power of two. Then, operations related to the ratio of the numerator and denominator can be performed using shift register operations, which are faster than division operations, or even by using a slow running adder or subtracter to calculate a progression of remainders or residues. With a fixed numerator, the denominator may be selectable to tune the ratio.

In some embodiments, the accumulator stage includes a pseudo-random binary sequence processor. This may be a shift register configuration or a so-called linear feedback shift register. A variety of feedback patterns are available that produce a PRBS. It is useful to choose a PRBS that has a pair of easily detectible symbols next to each other, so that sequences that vary by one cycle can be accommodated. The length of the PRBS can be tailored to the ratio of the denominator divided by the numerator by loading and reloading the PRBS shift register with a starting symbol to be responsive to the ratio. The number of cycles can be adjusted, responsive to a pattern of successive remainders.

The filter of the embodiments described above is simple enough (unlike the so-called brick wall filters used to construct sine waves from samples) that it can share device real estate with the accumulator stage, the selector, the DAC and the comparator. It can be implemented on an ASIC, a semi-custom ASIC, a RISC processor, a signal processor, or in a logic array, such as an FPGA. A single integrated circuit can include all five stages, thereby reducing the chip count of a device that takes advantage of the integration.

The data paths between stages can be implemented in a variety of ways, including current mode logic.

In any of the devices described above, the low value state may be held for a number of cycles separating a first terminal condition signal and a second terminal condition signal. The rising intermediate value state may last one cycle (or some other definite number of cycles may work, at a loss of range in the output pulse stream). The high value state may be held for a number of cycles separating the second terminal condition signal and a third terminal condition signal, with the falling intermediate value state lasting one cycle (or some other definite number of cycles). As the device steps through these transitions, the number of cycles between successive terminal condition signals will fluctuate by one cycle, unless the denominator divided by the numerator is an integer value.

Features and aspects of embodiments described above can be combined in a variety of ways which are fairly reflected in multiple dependencies of dependent claims.

Another device embodiment is expressed largely in means-plus-function terms. It includes means for generating a series of digital signals, a digital-to-analog converter with an offset, means for filtering the analog signal to produce a filtered wave form with periodically spaced crossing points, and a comparator that evaluates the crossing points to produce an output pulse stream.

The means for generating a series of digital signals produces an output that cycles among one or more low values, one rising intermediate value, one or more high values and one falling intermediate value. Any combination of the accumulator stage structures described above and selectors described above can be used as the means for generating the series of digital signals.

The transfer function of the digital-to-analog converter with the offset is described in a table, above.

Means for filtering the analog signal is illustrated as a variety of low pass filters in the figures. An integrator with a suitable decay might produce a similarly useful filtered waveform.

A comparator is also described above.

When the means for triangular filtering is a low pass filter, the resulting filtered wave form may be a truncated triangular waveform, with peaks and valleys of the waveform truncated when the crossing points of the filtered wave are not aligned with or of a period that matches the reference clock. Framed slightly differently, at least some of the peaks and valleys will be truncated when the denominator divided by numerator is not an integer.

Method embodiments build upon one another. A first method embodiment is a method of digitally synthesizing a pulse stream from a reference clock responsive to a ratio of the numerator divided by a denominator. This method includes generating a series of digital signals cycling among one or more repetitions of a low value, one rising intermediate value, one or more repetitions of a high value, and one falling intermediate value. The rising intermediate value and the falling intermediate value may be full range. That is, they may sometimes or always equal the low value or the high value, depending on the ratio.

The method further includes converting the series of digital signals to an analog signal. The offset is responsive to whether the cycling among values is rising or falling. This binary state could alternatively be expressed in many ways. The analog signal values are filtered to produce a filtered waveform that has periodically space crossing points of the desired frequency. By crossing points, we mean where the signal value moves from one side of a threshold to another. For instance, a threshold may be drawn across the middle of the analog signal, mid-range between the low value and high value of the signal. The crossing point is where the waveform intersects the threshold. The method continues by evaluating the crossing points of the filtered waveform to produce a pulse stream signal. The pulse stream has the desired frequency, responsive to the ratio of the numerator divided by the denominator.

Optionally, the digital to analog conversion may use an offset in a range of analog signal values produced, responsive to whether the cycling is rising or falling.

Aspects of this method embodiment substantially overlap with aspects of the device embodiments above. For instance, the cycling may be deemed to be rising if the generating is low or rising and deemed to be falling if the generating is high or falling. Alternatively, the cycling may be deemed to be rising if the generating is rising or high and falling if the generating is falling or low. The proper combination of successive states into a binary rising-or-falling signal may depend upon the implementation of the digital-to-analog converter.

As in the device embodiment, the filtered waveform of the methods may be a truncated triangular waveform, with peaks and valleys of the waveform truncated when the crossing points of the filtered waveform do not have a period that is an integer multiple of the reference clock period. The filtered waveform may be produced by applying a low pass filter.

An alternate method embodiment also involves digitally synthesizing a pulse stream from a reference clock responsive to a ratio of a numerator and a denominator. This method includes generating a terminal condition signal and a remainder signal iteratively, after numbers of cycles that it would take to reach an overflow condition by repeatedly accumulating the numerator and overflowing an accumulator that has a range from zero to the denominator minus one. The method further includes shifting a state machine between states, responsive to the terminal condition signal. The states include a low-value state, a rising intermediate value state, a high-value state and falling intermediate value state. Transition among the states is circular. The method further includes outputting a value signal and a binary rising-or-falling signal responsive to the states. This includes outputting a low value responsive to the low-value state and outputting a rising intermediate value, during the rising intermediate value state and responsive to the remainder signal. It includes outputting a high value responsive to the high-value state and outputting a falling intermediate value, during the falling intermediate value state, responsive to the remainder signal. The immediately preceding description may be considered an elaboration upon the generating action of the earlier method embodiment. The additional actions of converting, filtering and processing parallel the converting filtering and evaluating actions in the prior embodiment. Optionally, this method further may include converting the value signal and the binary rising-or-falling signal to an analog signal with an offset. The rising-or-falling signal determines whether an offset is applied to the value signal during digital-to-analog conversion. As a further option, the analog signal may be filtered to produce a filtered analog signal and the filtered analog signal processed through a comparator to produce a pulse stream signal. The resulting pulse stream signal has the desired frequency.

A further aspect of this method embodiment is that the numerator may be a fixed integer power of two and the denominator may be selectable to tune the ratio of the numerator and the denominator.

For both this and the prior method embodiment, the terminal condition signal may result from operating a pseudo-random binary sequence shift register with a starting symbol loaded into the shift register responsive to the ratio of the denominator and the numerator. The one cycle variation in the length of the sequence may be responsive to values of successive remainders. The pattern is illustrated in the table above. The period for which the four states are held may be the same in this method embodiment as in the prior one.

It is contemplated that modifications and combinations will occur to those skilled in the art, which modifications and combinations will be within the spirit of the invention and the scope of the following claims.

I claim:

1. A digital frequency generator that produces an output frequency relative to a reference clock, a device including:
   a reference clock signal having cycles,
   a numerator accessible in memory,
   a denominator accessible in memory,
   an accumulator stage coupled to the reference clock, the numerator and the denominator, that iteratively signals a terminal condition signal and a remainder signal after a number of cycles that it would take to reach an overflow condition by repeatedly accumulating the numerator and overflowing an accumulator that has a range from zero to the denominator minus one;
   a selector, coupled to the terminal condition signal and the remainder signal of the accumulator stage, including a state machine and an output section,
      wherein the state machine transitions, responsive to the terminal condition signal, through (a) a low value state, (b) a rising intermediate value state, (c) a high value state, (d) a falling intermediate value state, and circularly to (a) the low value state;
      wherein the output section outputs a value signal responsive to the state machine, (a) outputting a low value responsive to the low value state, (b) outputting a rising intermediate value, during the rising intermediate value state and responsive to the remainder signal, (c) outputting a high value responsive to the high value state, and (d) outputting a falling intermediate value, during the falling intermediate value state and responsive to the remainder signal,
      wherein the output section further outputs a binary rising-or-falling signal responsive to the state machine,
   a digital to analog converter (abbreviated DAC) coupled to the value signal and the rising-or-falling signal of the selector, wherein the DAC outputs an analog signal responsive the value signal with an offset responsive to the rising-or-falling signal;
   a filter coupled to the analog signal, outputting a filtered analog signal; and
   a comparator coupled to the filtered analog signal and outputting a stream of pulses.

2. The device of claim 1, wherein the numerator is a fixed integer power of 2 and denominator is selectable to tune a ratio of the numerator divided by the denominator.

3. The device of claim 2, wherein the accumulator stage includes a pseudo-random binary sequence (abbreviated PRBS) shift register and a symbol selector t hat loads the PRBS shift register with a starting symbol responsive to the ratio of the numerator divided by the denominator.

4. The device of claim 3, wherein the filter is integrated onto the same device component as the accumulator, the selector, the DAC and the comparator.

5. The device of claim 4, wherein the terminal condition signal and the remainder signal are implemented as current mode logic signals.

6. The device of claim 3, wherein the filter is integrated onto the same integrated circuit as the accumulator, the selector, the DAC and the comparator.

7. The device of claim 1, wherein (a) the low value state is held for a number of cycles separating a first terminal condition signal and a second terminal condition signal, (b) the rising intermediate value state lasts one cycle, (c) the high value state is held for a number of cycles separating the second terminal condition signal and a third terminal condition signal, and (d) the falling intermediate value state lasts one cycle.

8. The device of claim 7, wherein the numerator is a fixed integer power of 2 and denominator is selectable to tune a ratio of the numerator divided by the denominator.

9. The device of claim 8, wherein the accumulator includes a pseudo-random binary sequence (abbreviated PRBS) shift register and a symbol selector that loads the PRBS shift register with a starting symbol responsive to the ratio of the numerator divided by the denominator.

10. The device of claim 9, wherein the filter is a low pass filter formed on a substrate, the same substrate on which the accumulator, the selector, the DAC and the comparator are formed.

11. The device of claim 9, wherein the filter is integrated onto the same device as the accumulator, the selector, the DAC and the comparator.

12. The device of claim 11, wherein the terminal condition signal and the remainder signal are implemented as current mode logic signals.

13. A digital pulse stream synthesizing device that produces a pulse stream from a reference clock responsive to a ratio of a numerator divided by a denominator, the device including:
means for generating a series of digital signals cycling among (a) one or more low values, (b) one rising intermediate value, (c) one or more high values, and (d) one falling intermediate value, wherein the rising intermediate value and the falling intermediate value can be full range;
a digital to analog converter that converts the series of digital signals to an analog signal with an offset in a range of analog signal values produced, the offset responsive to whether the cycling is rising or falling;
means for filtering the analog signal to produce a filtered wave form that has periodically spaced crossing points; and
a comparator that evaluates the crossing points of the filtered wave form to produce a pulse stream signal.

14. The device of claim 13, wherein the filtered wave form produced by the means for filtering is a truncated triangular wave form, with peaks and valleys of the wave form truncated when the crossing points of the filtered wave form of a period that is an integer multiple of the reference clock period.

15. The device of claim 13, wherein the means for filtering includes a low pass filter that truncates peaks and valleys of the filtered wave form are not of a period that is an integer multiple of the reference clock period.

16. A method of digitally synthesizing a pulse stream from a reference clock responsive to a ratio of a numerator and a denominator, the method including:
generating a terminal condition signal and a remainder signal iteratively, after a number of cycles that it would take to reach an overflow condition by repeatedly accumulating the numerator and overflowing an accumulator that has a range from zero to the denominator minus one;
shifting a state machine between states responsive to the terminal condition signal, the states including (a) a low value state, (b) a rising intermediate value state, (c) a high value state, (d) a falling intermediate value state, and circularly to (a) the low value state;
outputting a value signal and a binary rising-or-falling signal responsive to the states, including (a) outputting a low value responsive to the low value state, (b) outputting a rising intermediate value, during the rising intermediate value state and responsive to the remainder signal, (c) outputting a high value responsive to the high value state, and (d) outputting a falling intermediate value, during the falling intermediate value state and responsive to the remainder signal;
converting the value signal and the binary rising-or-falling signal to an analog signal;
filtering the analog signal to produce a filtered analog signal; and
processing the filtered analog signal through a comparator to produce a pulse stream signal.

17. The method of claim 16, wherein the numerator is a fixed integer power of 2, the denominator is selectable to tune the ratio of the numerator and the denominator, and the terminal condition signal results from operating a pseudo-random binary sequence (abbreviated PRBS) shift register with a starting symbol loaded into the PRBS shift register responsive to the ratio of the numerator and the denominator.

18. The method of claim 17, further including (a) holding the low value state for a number of cycles separating a first terminal condition signal and a second terminal condition signal, (b) holding the rising intermediate value state for one cycle, (c) holding the high value state for a number of cycles separating the second terminal condition signal and a third terminal condition signal, and (d) holding the falling intermediate value state for one cycle.

19. The method of claim 17, wherein the rising-or-falling signal determines whether an offset is applied to the value signal.

20. The method of claim 16, further including (a) holding the low value state for a number of cycles separating a first terminal condition signal and a second terminal condition signal, (b) holding the rising intermediate value state for one cycle, (c) holding the high value state for a number of cycles separating the second terminal condition signal and a third terminal condition signal, and (d) holding the falling intermediate value state for one cycle.

* * * * *